(12) United States Patent
Loubet et al.

(10) Patent No.: US 9,337,079 B2
(45) Date of Patent: May 10, 2016

(54) PREVENTION OF CONTACT TO SUBSTRATE SHORTS

(71) Applicants: STMicroelectronics, Inc., Coppell, TX (US); International Business Machines Corporation, Armonk, NY (US)

(72) Inventors: Nicolas Loubet, Guilderland, NY (US); Qing Liu, Guilderland, NY (US); Shom Ponoth, Gaithersburg, MD (US)

(73) Assignees: STMicroelectronics, Inc., Coppell, TX (US); International Business Machines Corporation, Armonk, NY (US)

( * ) Notice: Subject to any disclaimer, the term of this patent is extended or adjusted under 35 U.S.C. 154(b) by 188 days.

(21) Appl. No.: 13/647,986

(22) Filed: Oct. 9, 2012

(65) Prior Publication Data

US 2014/0099769 A1    Apr. 10, 2014

(51) Int. Cl.
*H01L 21/70* (2006.01)
*H01L 21/762* (2006.01)
*H01L 21/84* (2006.01)

(52) U.S. Cl.
CPC .... *H01L 21/76232* (2013.01); *H01L 21/76283* (2013.01); *H01L 21/84* (2013.01)

(58) Field of Classification Search
CPC .......................... H01L 21/76224; H01L 21/76

USPC ......... 257/499, 501, 505, 506, 510, 524, 520, 257/527, E21.546, E21.54

See application file for complete search history.

(56) References Cited

U.S. PATENT DOCUMENTS

| | | | |
|---|---|---|---|
| 6,380,010 B2 * | 4/2002 | Brigham et al. ............... | 438/161 |
| 6,503,799 B2 * | 1/2003 | Horita et al. ................... | 438/269 |
| 6,924,517 B2 * | 8/2005 | Chen et al. ..................... | 257/213 |
| 8,021,955 B1 * | 9/2011 | Gopinath et al. .............. | 438/424 |
| 2010/0025805 A1 * | 2/2010 | Hall et al. ...................... | 257/506 |
| 2010/0289116 A1 * | 11/2010 | Lin et al. ........................ | 257/510 |
| 2011/0266648 A1 * | 11/2011 | Cho et al. ....................... | 257/506 |
| 2012/0043641 A1 * | 2/2012 | Yu et al. ......................... | 257/506 |

* cited by examiner

*Primary Examiner* — Julia Slutsker
(74) *Attorney, Agent, or Firm* — Seed IP Law Group PLLC

(57) ABSTRACT

Isolation trenches are etched through an active silicon layer overlying a buried oxide on a substrate into the substrate, and through any pad dielectric(s) on the active silicon layer. Lateral epitaxial growth of the active silicon layer forms protrusions into the isolation trenches to a lateral distance of at least about 5 nanometers, and portions of the isolation trenches around the protrusions are filled with dielectric. Raised source/drain regions are formed on portions of the active silicon layer including a dielectric. As a result, misaligned contacts passing around edges of the raised source/drain regions remain spaced apart from sidewalls of the substrate in the isolation trenches.

17 Claims, 6 Drawing Sheets

PREVENTION OF CONTACT TO SUBSTRATE SHORTS

TECHNICAL FIELD

The present disclosure relates generally to fabricating semiconductor-on-insulator integrated circuits and, more specifically, to avoiding contact related shorts to the substrate in a semiconductor-on-insulator integrated circuit.

BACKGROUND

Due to the limited hydrofluoric (HF) acid budget that a typical semiconductor-on-insulator (SOI) based transistor fabrication process entails, in the case of a thin buried oxide (BOX) the substrate may be exposed either fully or in part at the divot, particularly with Ultra-Thin Body and BOX (UTBB) substrates. This can cause SOI/substrate shorts through a misaligned contact going over the shallow trench isolation (STI) and connecting the source/drain (S/D) with the substrate. Because of the thin BOX, the contact etch has very marginal room.

There is, therefore, a need in the art for improved protection against shorts from a source/drain region to the substrate due to penetration of misaligned contacts through the buried oxide.

SUMMARY

Isolation trenches are etched through an active silicon layer overlying a buried oxide on a substrate into the substrate, and through any pad dielectric(s) on the active silicon layer. Lateral epitaxial growth of the active silicon layer forms protrusions into the isolation trenches to a lateral distance of at least about 5 nanometers, and portions of the isolation trenches around the protrusions are filled with dielectric. Raised source/drain regions are formed on portions of the active silicon layer including a dielectric. As a result, misaligned contacts passing around edges of the raised source/drain regions remain spaced apart from sidewalls of the substrate in the isolation trenches.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

FIGS. 1 through 4, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system.

Figure 1:
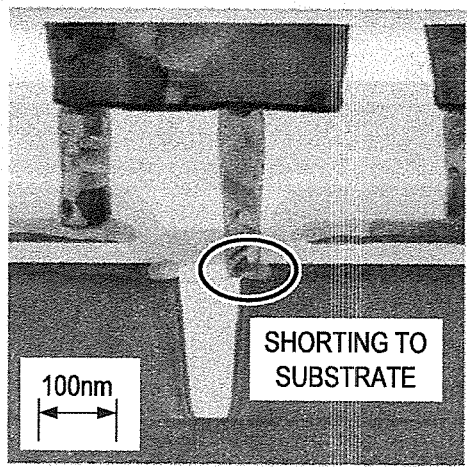
FIG. 1 depicts a sectional view of an integrated circuit structure showing a contact short to a UTBB substrate.

FIG. 1 depicts a sectional view of an integrated circuit structure showing a contact short to a UTBB substrate. In the image, a vertical contact is misaligned with the source/drain region and penetrates the thin BOX to contact both the STI and a sidewall of the substrate beneath the thin BOX, shorting the source/drain to the substrate.

Figure 2:
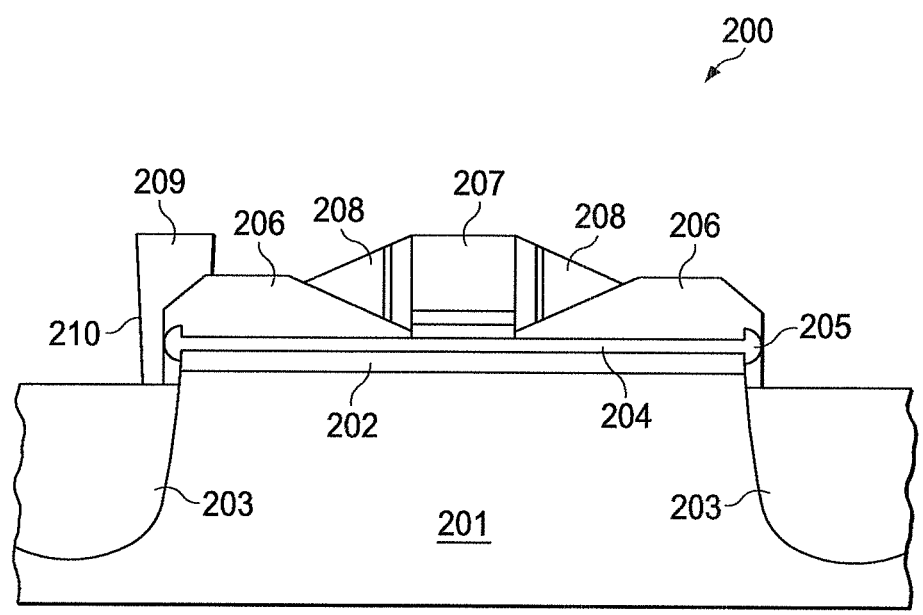
FIG. 2 is a sectional view of a portion of a semiconductor integrated circuit structure avoiding contact related shorts to the substrate using side epitaxy in accordance with one embodiment of the present disclosure.

FIG. 2 is a sectional view of a portion of a semiconductor integrated circuit structure avoiding contact related shorts to the substrate using side epitaxy in accordance with one embodiment of the present disclosure. The integrated circuit structure 200 includes a substrate (e.g., a p-type region) 201 formed with a thin BOX layer 202 and STI regions 203. A semiconductor (e.g., silicon) layer 204 is formed on the BOX layer 202 and, by side epitaxy, protrusions 205 are grown to extend past the edges of BOX layer 202 and overhang a portion of the STI regions 203. Raised source/drain regions 206 are formed on the semiconductor layer 204, including on the protrusions 205, adjacent a gate (including a gate electrode, a barrier layer and a gate insulator in the example of FIG. 2) and the adjoining sidewall spacers 208 (illustrated in FIG. 2 as including multiple layers).

When a contact 209 is misaligned with the respective source/drain region 206, the portion 210 of the contact extending down to (or even into) the STI regions 203 does not contact the substrate 201. The protrusions 205 provide lateral spacing between the edges of source/drain regions 206 and the sidewalls of the substrate 201 (at the interface with STI regions 203). As a result, no shorting from source/drain regions to substrate appears. The lateral distance created by the protrusions 205 through side epitaxy allows contact reactive ion etching (RIE) overetch in an amount that increases dramatically with the side epitaxy, even with a thin BOX layer 202.

FIGS. 3A through 3K are sectional views of a portion of a semiconductor integrated circuit structure during a process of using side epitaxy to avoid contact related shorts to the substrate in accordance with one embodiment of the present disclosure. FIG. 4 is a high level flow chart illustrating a process of using side epitaxy to avoid contact related shorts to the substrate in accordance with one embodiment of the present disclosure. While only a transistor region is illustrated, those skilled in the art will understand that the same structures are concurrently formed using the same process for many different transistors on an integrated circuit die, and on many different die within a wafer.

Those skilled in the art will recognize that the structures of FIGS. 3A through 3K, while generally drawn to illustrate approximate relative sizes or dimensions, are not drawn to scale. Those skilled in the art will further recognize that the full process for forming an integrated circuit and the associated structures are not illustrated in the drawings or described herein. Instead, for simplicity and clarity, only so much of a process for forming an integrated circuit and the associated structures as is unique to the present disclosure or necessary for an understanding of the present disclosure is depicted and described. In addition, although various steps are illustrated in the drawings and described herein, no limitation regarding the order of such steps or the presence or absence of intervening steps is implied. Steps depicted or described as sequential are, unless explicitly specified, merely done so for purposes of explanation without precluding the possibility that the respective steps are actually performed in concurrent or overlapping manner, at least partially if not entirely.

Figure 3A:
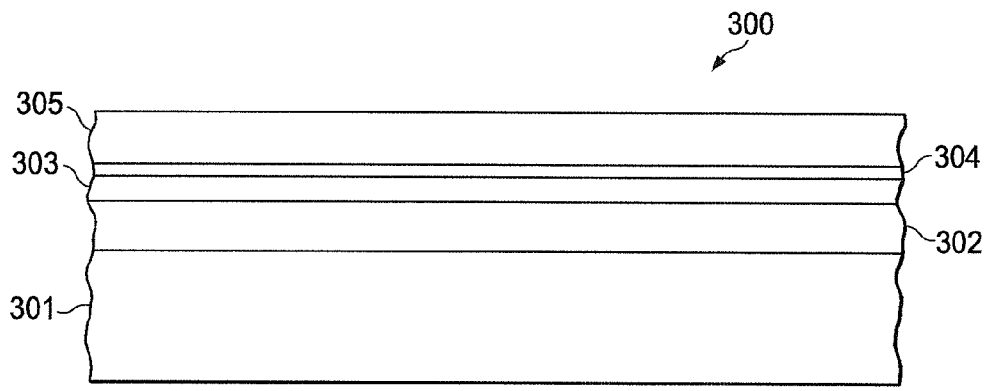
FIGS. 3A through 3K are sectional views of a portion of a semiconductor integrated circuit structure during a process of using side epitaxy to avoid contact related shorts to the substrate in accordance with one embodiment of the present disclosure.
Figure 3B:
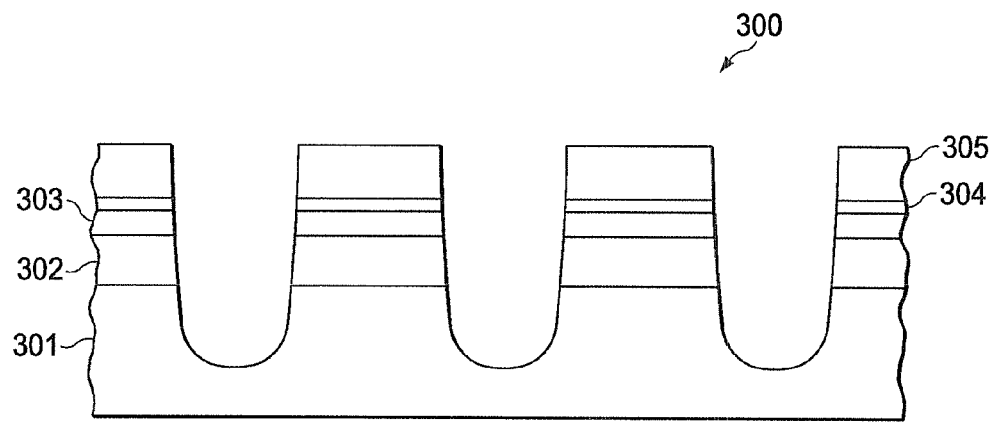
Figure 3C:
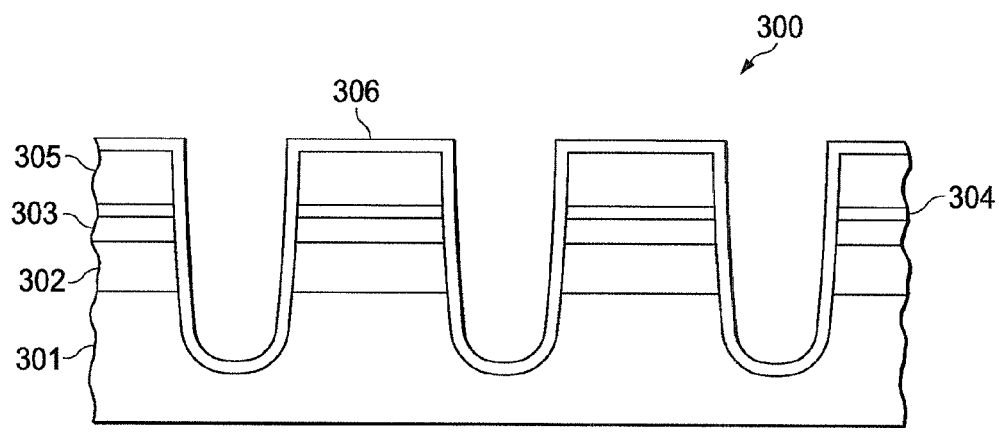
Figure 4:
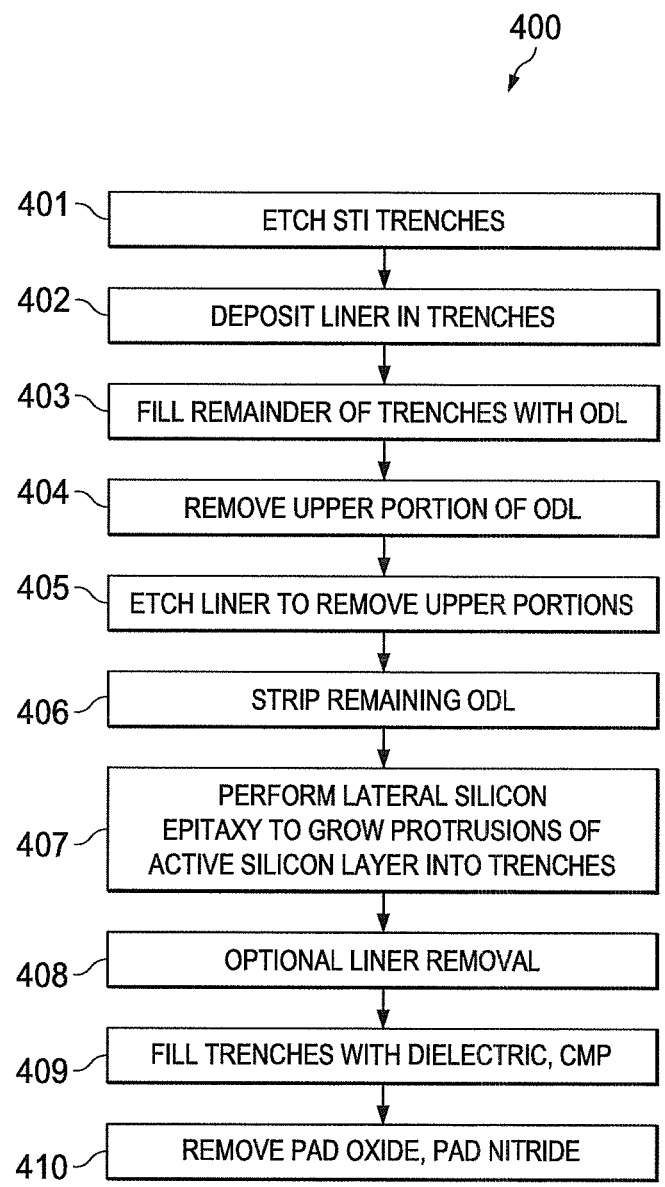
FIG. 4 is a high level flow chart illustrating a process of using side epitaxy to avoid contact related shorts to the substrate in accordance with one embodiment of the present disclosure.

Referring first to FIG. 3A, the process 400 begins with an integrated circuit structure 300 including a doped semiconductor region 301 (e.g., a p-type semiconductor material), a BOX layer 302 on the semiconductor region 301, an active semiconductor layer 303 (e.g., undoped silicon) formed on the BOX layer 302, and a pad oxide 304 and a pad nitride 305 firmed on the active semiconductor layer 303. Lithography and a preferably directional etch (e.g., RIE) are employed (step 401) to form the trenches for STI regions, as shown in FIG. 3B. A conformal liner 306 is then deposited in the trenches (step 402), as shown in FIG. 3C.

Figure 3D:
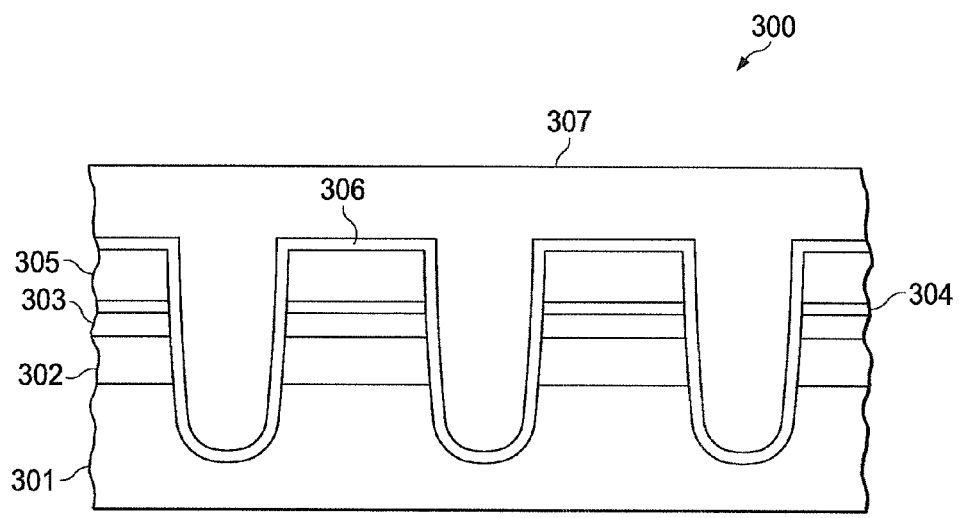
Figure 3E:
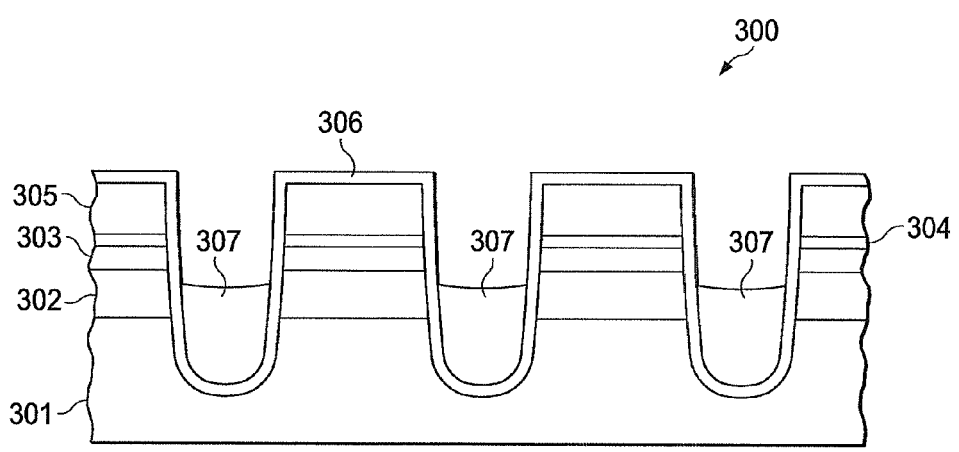
Figure 3F:
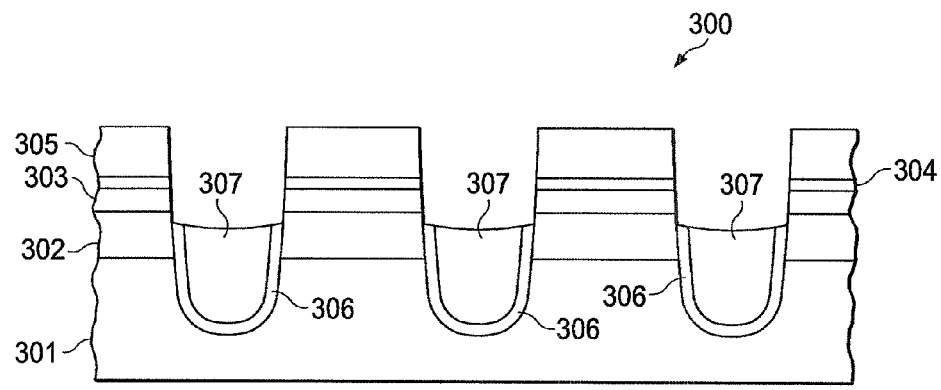
Figure 3G:
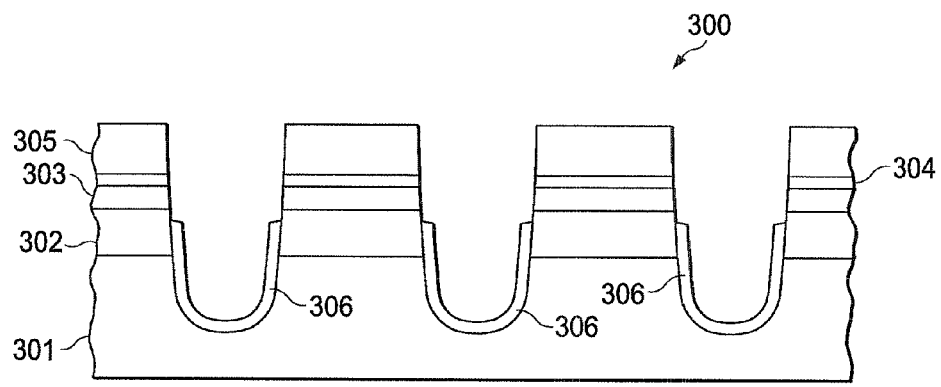
Figure 3H:
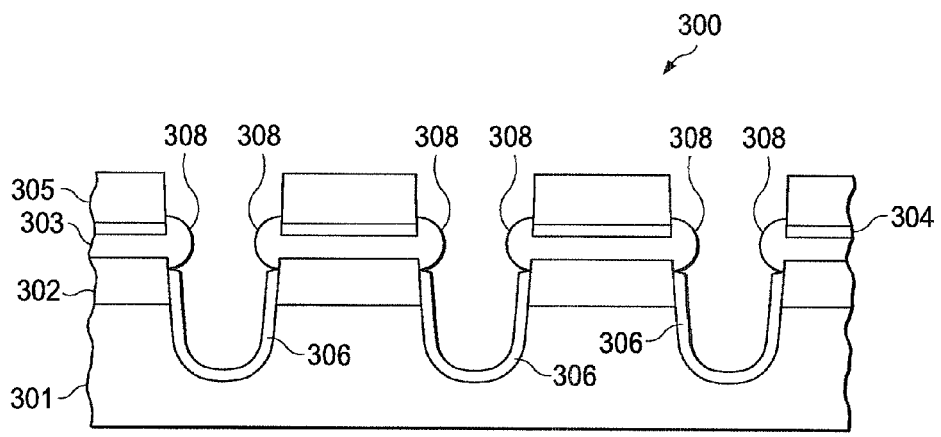
Figure 3I:
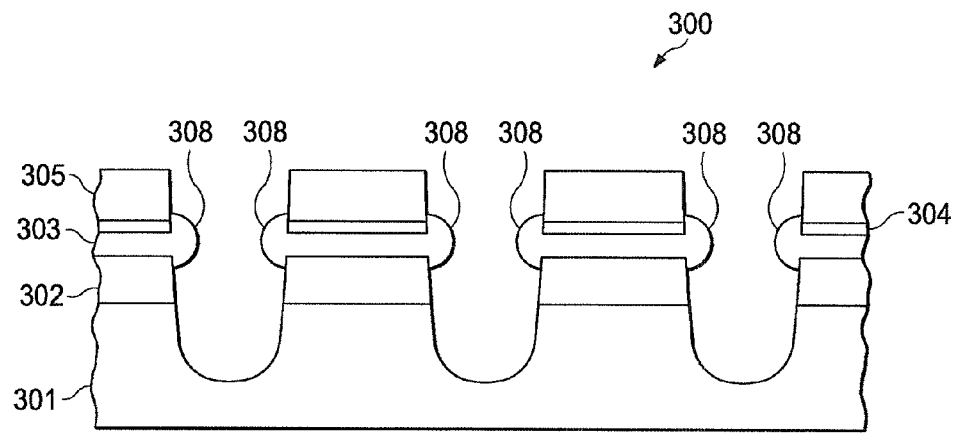

The remaining unfilled portions of the etched trenches are filled with an organic dielectric layer (ODL) 307 (step 403), as shown in FIG. 3D. The ODL is then removed to a level below the lower boundary of the active semiconductor layer 303 (step 404), as illustrated in FIG. 3E, portions of the liner 306 above the level of the ODL 307 are removed (step 405), as illustrated in FIG. 3F, and the remaining ODL material is stripped (step 406), as illustrated in FIG. 3G. Side or lateral silicon epitaxy is then performed (step 407) to grow the protrusions 308 from the active semiconductor layer 303 into the trenches depicted in FIG. 3H. The protrusions 308 are grown to a sufficient lateral distance to cause an overhang precluding physical contact by any conductive material passing down past an end of the protrusions 308 with sidewalls of the substrate 301. An optional removal of the remaining liner material within the trenches (step 408) may then be performed, as illustrated in FIG. 3I.

Figure 3J:
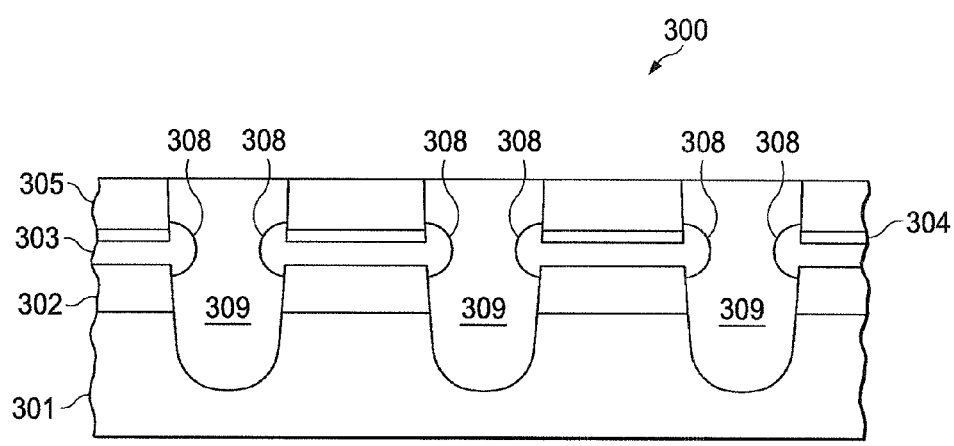
Figure 3K:
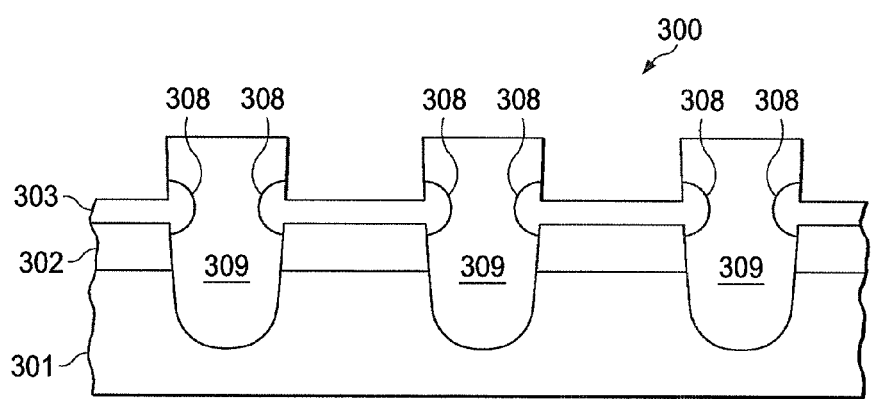

The STI trenches are then filled with a dielectric 309 and a chemical mechanical polish (CMP) is performed to planarize an upper surface of the integrated circuit structure 300 (step 409), as shown in FIG. 3J. The pad oxide 304 and pad nitride 305 are then removed from the surface of the active semiconductor material 303 (step 410), as shown in FIG. 3K. The gate structure, sidewall spacers and raised source/drain regions may then be formed, following by contacts to at least one of the raised source/drain regions, as described above.

The present disclosure employs active patterning and RIE to mask the silicon at the interface with STI regions. Lateral epitaxial growth of silicon occurs only on unmasked region, in this case only around the active regions. Lateral epitaxial growth of only about 5 nanometers (nm) is sufficient to protect against contact shorts between the source/drain regions and the substrate. The solution of the present disclosure provides good uniformity and thickness control, and the active areas are enlarged with epitaxy while still keeping the same isolation properties. Only nominal modifications, if any, of existing fabrication processes are required.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. An integrated circuit structure that includes a transistor, comprising:
    an isolation region filled with a dielectric material, the isolation region extending through an active semiconductor layer and through an overlying a buried oxide layer on a substrate and into the substrate, the active semiconductor layer being electrically isolated from the substrate by the buried oxide layer that is positioned between them;
    an epitaxial region of the active semiconductor layer protruding into a sidewall of the dielectric material in the isolation region to form a protrusion having a curved profile;
    a gate dielectic overlying the active semiconductor layer at location spaced away from the epitaxial region protrusion;
    a gate electrode overlying the gate dielectric;
    a source/drain region overlying and abutting in physical and electrical contact with the active semiconductor layer; and
    a conductive material being in physical and electrical contact with the source/drain region to form a source/drain contact.

2. The integrated circuit structure according to claim 1, wherein the epitaxial region protrudes to a lateral distance into the isolation region sufficient to prevent contact between the conductive material forming the contact passing along the epitaxial region and a sidewall of the substrate.

3. The integrated circuit structure according to claim 2, wherein the epitaxial region protrudes to a lateral distance of about 5 nanometers (nm).

4. The integrated circuit structure according to claim 1, further comprising: a dielectric filling portions of the isolation region around the epitaxial region.

5. The integrated circuit structure according to claim 1, further comprising:
    a pad oxide layer and a pad nitride layer on the active semiconductor layer, through which the isolation region extends, wherein the epitaxial region protrudes from an edge of the active semiconductor layer exposed by the isolation region.

6. The integrated circuit structure according to claim 1, further comprising:
    a conformal liner in the isolation region; and
    an organic dielectric filling a portion of the isolation trench to a level below the active semiconductor layer.

7. An integrated circuit structure comprising:
    an isolation region that extends through an active region of silicon into a silicon substrate, the isolation region containing an insulating material;
    a buried oxide layer, through which the isolation region extends downward into the silicon substrate, the active semiconductor layer being electrically isolated from the substrate by the buried oxide layer being positioned between them;

a pair of curved indentations protruding into opposite sidewalls of the isolation region, the curved indentations filled with epitaxially grown extensions of the active region of silicon;

a gate dielectric overlying the active semiconductor layer at location spaced away from the epitaxial region protrusion;

a gate electrode overlying the gate dielectric;

a source/drain overlying and abutting in physical and electrical contact with the active semiconductor layer; and a conductive material being in physical and electrical contact with the source/drain region to form a source/drain contact.

8. The integrated circuit structure of claim 7 wherein the epitaxially grown extensions have isotropic profiles.

9. The integrated circuit structure of claim 8 wherein the isotropic profiles are semi-circular.

10. The integrated circuit structure of claim 7 wherein a size of the epitaxially grown extensions exceeds a thickness of the active layer.

11. The integrated circuit structure of claim 7, further comprising a conformal liner covering at least a lower portion of an inner surface of the isolation region.

12. The integrated circuit structure of claim 10 wherein the conformal liner extends between the pair of indentations.

13. An array of integrated circuit structures according to claim 7 wherein the substrate between adjacent isolation regions is fully covered by the active region of silicon.

14. The integrated circuit structure of claim 7, further including a plurality of isolation regions.

15. An integrated circuit structure that includes a transistor, comprising:

a silicon substrate;

an electrically insulating oxide layer overlying the silicon substrate;

an active semiconductor layer overlying the oxide, the active semiconductor layer being electrically isolated from the substrate by the oxide layer that is positioned between them;

an electrical isolation region filled with a dielectric material extending through the active semiconductor layer, through the overlying buried oxide layer and into the substrate;

an epitaxially grown region of the active semiconductor layer protruding laterally into a sidewall of the dielectric material in the isolation region to form a protrusion into the dielectric material;

a gate dielectric overlying the active semiconductor layer at location spaced away from the epitaxial region protrusion;

a gate electrode overlying the gate dielectric;

a source/drain region overlying and in physical and electrical contact with the active semiconductor layer; and a conductive material being in physical and electrical contact with the source/drain region to form a source/drain contact.

16. The structure of claim 15 in which the protrusion has a curved profile along its outer layer that contacts the dielectric material.

17. The integrated circuit structure according to claim 15, wherein the epitaxially grown region protrudes to a lateral distance into the isolation region sufficient to prevent contact between the conductive material being in electrical contact with the epitaxial region and a sidewall of the substrate.

* * * * *